(12) United States Patent
Iwashita et al.

(10) Patent No.: US 12,027,344 B2
(45) Date of Patent: Jul. 2, 2024

(54) FILM FORMING APPARATUS

(71) Applicant: Tokyo Electron Limited, Tokyo (JP)

(72) Inventors: Shinya Iwashita, Yamanashi (JP);
Ayuta Suzuki, Yamanashi (JP);
Takahiro Shindo, Yamanashi (JP);
Kazuki Dempoh, Yamanashi (JP);
Tatsuo Matsudo, Yamanashi (JP);
Yasushi Morita, Yamanashi (JP);
Takamichi Kikuchi, Yamanashi (JP);
Tsuyoshi Moriya, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 3 days.

(21) Appl. No.: 17/974,193

(22) Filed: Oct. 26, 2022

(65) Prior Publication Data

US 2023/0051432 A1      Feb. 16, 2023

Related U.S. Application Data

(63) Continuation of application No. 16/431,565, filed on Jun. 4, 2019, now abandoned.

(30) Foreign Application Priority Data

Jun. 13, 2018  (JP) .................................. 2018-112585

(51) Int. Cl.
   *C23C 16/00*      (2006.01)
   *H01J 37/32*      (2006.01)
   (Continued)

(52) U.S. Cl.
   CPC .. *H01J 37/32027* (2013.01); *H01J 37/32091* (2013.01); *H01J 37/32183* (2013.01);
   (Continued)

(58) Field of Classification Search
   CPC ................................................ H01J 37/32027
   See application file for complete search history.

(56) References Cited

U.S. PATENT DOCUMENTS

| 4,812,712 A | 3/1989 | Ohnishi et al. |
| 7,968,437 B2 | 6/2011 | Itatani et al. |
| (Continued) | | |

FOREIGN PATENT DOCUMENTS

| CN | 102157372 A | 8/2011 |
| CN | 102209426 A | 10/2011 |
| (Continued) | | |

OTHER PUBLICATIONS

United States Office Action, U.S. Appl. No. 16/431,565, filed Jun. 21, 2022, 18 pages.
(Continued)

*Primary Examiner* — Sylvia MacArthur
*Assistant Examiner* — Michelle Crowell
(74) *Attorney, Agent, or Firm* — Fenwick & West LLP (57) ABSTRACT

A film forming apparatus includes a vacuum-evacuable processing chamber, a lower electrode for mounting thereon a target substrate, an upper electrode disposed to face the lower electrode, a gas supply unit, a voltage application unit and a switching unit. The gas supply unit supplies a film forming source gas to be formed into plasma to a processing space between the upper and the lower electrode. The voltage application unit applies to the upper electrode a voltage outputted from at least one of a high frequency power supply and a DC power supply included therein. The switching unit selectively switches the voltage to be applied to the upper electrode among a high frequency voltage outputted from the high frequency power supply, a DC voltage outputted from the DC power supply, and a super-
(Continued)

imposed voltage in which the DC voltage is superimposed with the high frequency voltage.

9 Claims, 8 Drawing Sheets

(51) Int. Cl.
    *H01L 21/00*     (2006.01)
    *H01L 21/67*     (2006.01)

(52) U.S. Cl.
    CPC .. H01J 37/32568 (2013.01); H01L 21/67253 (2013.01); *H01J 2237/327* (2013.01); *H01J 2237/3321* (2013.01); *H01J 2237/334* (2013.01)

(56) References Cited

U.S. PATENT DOCUMENTS

| | | | |
|---|---|---|---|
| 8,303,834 | B2 | 11/2012 | Honda et al. |
| 8,545,671 | B2 | 10/2013 | Honda |
| 9,818,600 | B2 | 11/2017 | Sato |
| 10,170,300 | B1* | 1/2019 | Tsukazawa ......... C23C 16/4584 |
| 10,629,415 | B2 | 4/2020 | Susa |
| 2006/0066247 | A1 | 3/2006 | Koshiishi et al. |
| 2007/0029194 | A1 | 2/2007 | Matsumoto et al. |
| 2008/0053817 | A1 | 3/2008 | Koshimizu et al. |
| 2008/0317965 | A1 | 12/2008 | Son et al. |
| 2009/0044752 | A1 | 2/2009 | Furuya |
| 2009/0078678 | A1 | 3/2009 | Kojima et al. |
| 2009/0194508 | A1 | 8/2009 | Ui et al. |
| 2009/0223933 | A1 | 9/2009 | Iwata et al. |
| 2010/0248489 | A1 | 9/2010 | Koguchi et al. |
| 2011/0014795 | A1 | 1/2011 | Lee et al. |
| 2011/0240599 | A1* | 10/2011 | Honda ............... H01J 37/32541 156/345.44 |
| 2012/0052689 | A1 | 3/2012 | Tokashiki |
| 2012/0247677 | A1 | 10/2012 | Himori et al. |
| 2014/0057447 | A1 | 2/2014 | Yang et al. |
| 2015/0099072 | A1* | 4/2015 | Takamure ............. C23C 16/308 427/577 |
| 2015/0255305 | A1 | 9/2015 | Nakagawa |
| 2016/0064194 | A1 | 3/2016 | Tokashiki et al. |
| 2016/0372324 | A1* | 12/2016 | Kao ................... H01L 21/02186 |
| 2017/0365561 | A1 | 12/2017 | Shiu et al. |
| 2018/0076063 | A1 | 3/2018 | Nakayama et al. |
| 2018/0108534 | A1* | 4/2018 | Shindo ............. H01L 21/31144 |
| 2019/0043694 | A1 | 2/2019 | Park |
| 2020/0335306 | A1 | 10/2020 | Kon |

FOREIGN PATENT DOCUMENTS

| | | |
|---|---|---|
| CN | 107723682 A | 2/2018 |
| JP | H08-181118 A | 7/1996 |
| JP | H11-31685 A | 2/1999 |
| JP | 2002-217278 A | 8/2002 |
| JP | 2003-166047 A | 6/2003 |
| JP | 2004-158247 A | 6/2004 |
| JP | 2008-305856 A | 12/2008 |
| JP | 2009-239012 A | 10/2009 |
| JP | 5714048 B2 | 5/2015 |
| JP | 2016-105490 A | 6/2016 |
| KR | 10-1749766 B1 | 6/2017 |
| KR | 10-2018-0018385 A | 2/2018 |

OTHER PUBLICATIONS

United States Office Action, U.S. Appl. No. 16/431,565, filed Dec. 20, 2021, 15 pages.

United States Office Action, U.S. Appl. No. 16/431,565, filed Sep. 13, 2021, 13 pages.

United States Office Action, U.S. Appl. No. 16/431,565, filed Mar. 4, 2021, 14 pages.

\* cited by examiner

| PRESSURE | REFRACTIVE INDEX (WAVELENGTH 633nm) | | |
|---|---|---|---|
| | RF | RF+DC | DC |
| 0.5Torr | 2.35 | 2.23 | 2.27 |
| 2Torr | 2.39 | 2.32 | 2.34 |

FILM FORMING APPARATUS

CROSS-REFERENCE TO RELATED APPLICATIONS

This application is a continuation of U.S. patent application Ser. No. 16/431,565, filed on Jun. 4, 2019, which claims priority to Japanese Patent Application No. 2018-112585 filed on Jun. 13, 2018, the entire contents of which are incorporated herein by reference.

TECHNICAL FIELD

The present disclosure relates to a film forming apparatus.

BACKGROUND

Conventionally, in manufacturing semiconductor integrated circuits, a film formation is performed on a substrate such as a semiconductor wafer or the like by using a film forming apparatus. In the film forming apparatus, the substrate is disposed in a chamber (processing chamber) set to a predetermined vacuum level, and a film forming source gas is supplied into the chamber to generate plasma so that a film is formed on the substrate. As an example of a film formation technique, there is known, e.g., plasma chemical vapor deposition (CVD), plasma atomic layer deposition (ALD) or the like (see, e.g., Japanese Patent Application Publication No. 2009-239012).

The present disclosure provides a technique capable of variously controlling film qualities of thin films formed by the identical film forming apparatus.

SUMMARY

In accordance with an embodiment, there is provided a film forming apparatus including: a vacuum-evacuable processing chamber; a lower electrode on which a target substrate to be processed is mounted in the processing chamber; an upper electrode disposed to face the lower electrode in the processing chamber; a gas supply unit configured to supply a film forming source gas to be formed into plasma to a processing space between the upper electrode and the lower electrode; a voltage application unit including a high frequency power supply and a DC power supply and configured to apply a voltage outputted from at least one of the high frequency power supply and the DC power supply to the upper electrode; and a switching unit configured to selectively switch the voltage outputted from the voltage application unit to the upper electrode among a high frequency voltage outputted from the high frequency power supply, a DC voltage outputted from the DC power supply, and a superimposed voltage in which the DC voltage is superimposed with the high frequency voltage.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of a film forming apparatus according to the present disclosure will be described in detail with reference to the accompanying drawings. The present disclosure is not to be construed as being limited to the following embodiments. Further, it should be noted that the drawings are schematic, and thus relationships between dimensions of the elements, ratios between the elements and the like may differ from those of the actual elements. The relationships and ratios between the dimensions may differ from each other among the drawings.

Conventionally, in manufacturing semiconductor integrated circuits, a film formation is performed on a substrate such as a semiconductor wafer or the like by using a film forming apparatus. In the film forming apparatus, the substrate is disposed in a chamber (processing chamber) set to a predetermined vacuum level, and a film forming source gas is supplied into the chamber to generate plasma, so that a film is formed on the substrate. As an example of a film formation technique, there is known, e.g., plasma chemical vapor deposition (CVD), plasma atomic layer deposition (ALD) or the like.

In the conventional technique, even if various film forming parameters are to be changed, it is difficult to variously control film qualities of thin films formed by using the same film forming apparatus.

Therefore, it is required to variously control the film qualities of the thin films formed by using the same film forming apparatus.

<Configuration of Film Forming Apparatus>

Figure 1:
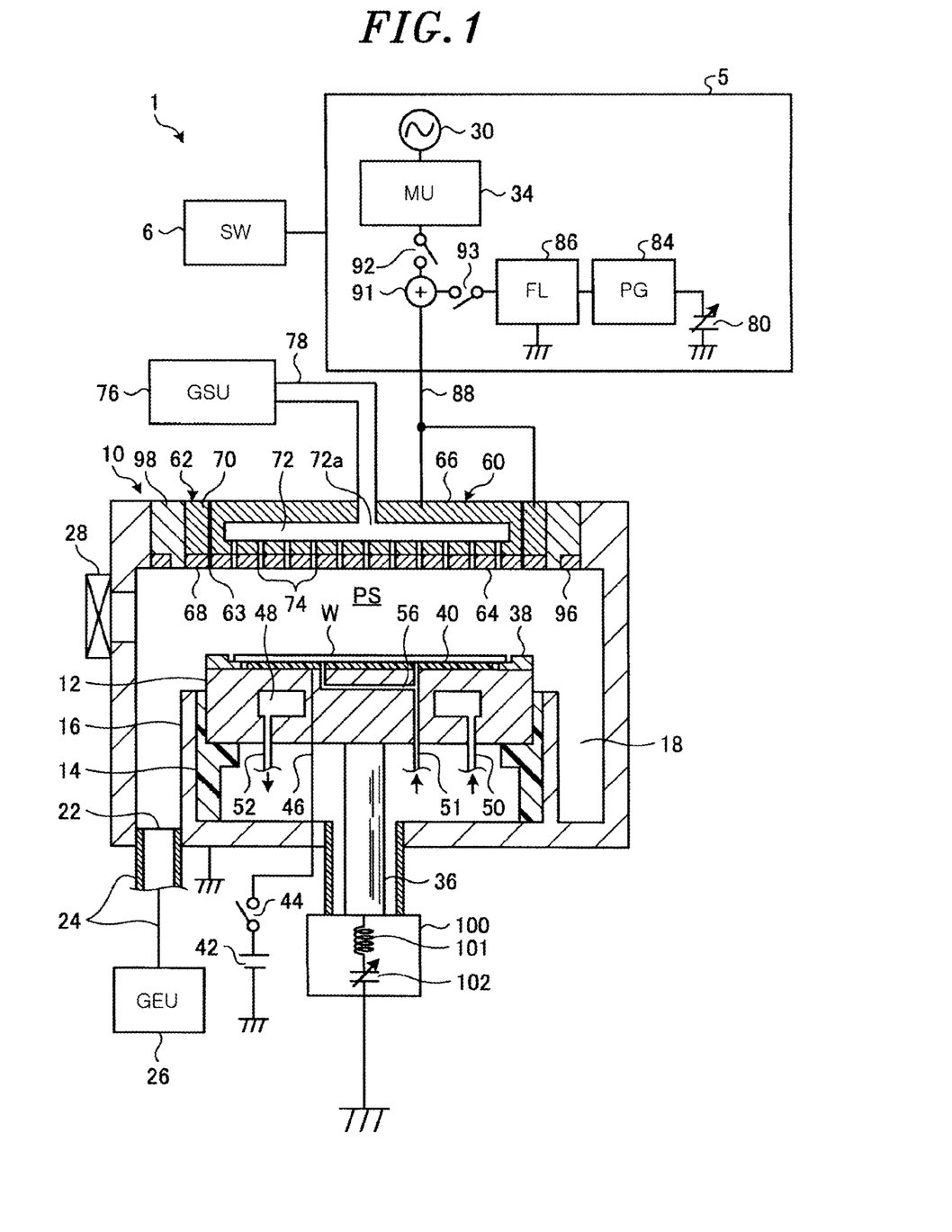
FIG. 1 shows an example of a configuration of a film forming apparatus according to one embodiment.

FIG. 1 shows an example of a configuration of a film forming apparatus according to an embodiment. In FIG. 1, a film forming apparatus 1 includes a chamber (processing chamber) 10 made of a metal such as aluminum, stainless steel or the like. The chamber 10 is frame-grounded.

A disk-shaped susceptor 12 on which a semiconductor wafer W serving as a target substrate is to be mounted is horizontally disposed in the chamber 10. The susceptor 12 serves as a lower electrode. A gate valve 28 is provided at a sidewall of the chamber 10 to open and close a loading/unloading port for loading and unloading the semiconductor wafer W. The susceptor 12 is made of, e.g., aluminum, AlN ceramic or nickel and supported by a cylindrical insulating support 14 extending vertically upward from a bottom portion of the chamber 10.

An annular gas exhaust path 18 is formed between the sidewall of the chamber 10 and a cylindrical conductive support (inner wall portion) 16 extending vertically upward from the bottom portion of the chamber 10 along an outer periphery of the cylindrical support 14. A gas exhaust port 22 is formed at a bottom portion of the gas exhaust path 18.

A gas exhaust unit 26 is connected to the gas exhaust port 22 through a gas exhaust pipe 24. The gas exhaust unit 26 includes a vacuum pump, e.g., a turbo molecular pump or the like, and decreases a pressure in a processing space in the chamber 10 to a desired vacuum level. It is preferable to maintain the pressure in the chamber 10 at a constant level, e.g., in a range from 500 mTorr to 5000 mTorr.

An impedance control circuit 100 having a coil 101 and a capacitor 102 is electrically connected through a connecting rod 36 between the susceptor 12 serving as the lower electrode and the ground. The impedance control circuit 100 includes a combination of a variable coil and a fixed capacitor or a combination of a fixed coil and a variable capacitor. The former combination is used when a frequency of a high frequency power supply is several MHz or less, and the latter combination is used when the frequency of the high frequency power is several MHz or more. For example, when the frequency of the high frequency power supply is 13.56 MHz, the impedance adjustment circuit including a fixed coil and a variable capacitor is used.

The semiconductor wafer W is mounted on the susceptor 12, and a ring 38 is disposed to surround the semiconductor wafer W. The ring 38 is made of a conductive material (e.g., nickel or aluminum) that exerts minimal adverse influence on the processing. The ring 38 is detachably attached to an upper surface of the susceptor 12.

An electrostatic chuck 40 for attracting and holding the semiconductor wafer may be disposed on the upper surface of the susceptor 12. The electrostatic chuck 40 is formed by embedding a sheet-shaped conductor or a mesh-shaped conductor in a film-shaped dielectric member or a plate-shaped dielectric member.

A DC power supply 42 disposed outside the chamber 10 is electrically connected to the conductor in the electrostatic chuck 40 through an on/off switch 44 and a power supply line 46. The semiconductor wafer W is attracted and held on the electrostatic chuck 40 by a coulomb force generated on the electrostatic chuck 40 by the DC voltage applied from the DC power supply 42.

An annular coolant chamber 48 extending in a circumferential direction is disposed in the susceptor 12. A coolant (e.g., cooling water) having a predetermined temperature is supplied from a chiller unit (not shown) and circulated in the coolant chamber 48 through lines 50 and 52. The temperature of the semiconductor wafer W on the electrostatic chuck 40 is controlled by the temperature of the coolant.

In order to accurately control the wafer temperature, a heat transfer gas (e.g., He gas) is supplied from a heat transfer gas supply unit (not shown) to a space between the electrostatic chuck 40 and the semiconductor wafer W through the gas supply line 51 and a gas passage 56 in the susceptor 12.

A disk-shaped inner upper electrode 60 and a ring-shaped outer upper electrode 62 are concentrically disposed at the ceiling of the chamber 10 to face the susceptor 12 in parallel (i.e., to be opposite to the susceptor 12).

As for an appropriate size in a radial direction, the inner upper electrode 60 has a diameter approximately equal to that of the semiconductor wafer W, and the outer upper electrode 62 has diameters (inner diameter and outside diameter) approximately equal to those of the ring 38. However, the inner upper electrode 60 and the outer upper electrode 62 are electrically insulated (more precisely, in a DC manner) from each other. A ring-shaped insulator 63 made of, e.g., ceramic, is inserted between the inner upper electrode 60 and the outer upper electrode 62.

The inner upper electrode 60 includes an electrode plate 64 directly facing the susceptor 12 and an electrode support 66 for detachably supporting the electrode plate 64 from a back (upper) side of the electrode plate 64. The electrode plate 64 is preferably made of a conductive material such as nickel, aluminum, or the like.

The electrode support 66 is made of, e.g., alumite-treated aluminum or nickel. The outer upper electrode 62 includes an electrode plate 68 facing the susceptor 12 and an electrode support 70 for detachably supporting the electrode plate 68 from a back (upper) side thereof.

The electrode plate 68 and the electrode support 70 are preferably made of the same material as those of the electrode plate 64 and the electrode support 66, respectively. Hereinafter, the inner upper electrode 60 and the outer upper electrode 62 may be collectively referred to as "upper electrodes 60 and 62." In the film forming apparatus 1, the disk-shaped susceptor 12 (i.e., the lower electrode) and the disk-shaped upper electrodes 60 and 62 face each other in parallel.

Further, although the upper electrode in the present embodiment is configured to have two members, i.e., the inner upper electrode 60 and the outer upper electrode 62, the upper electrode may be configured to have one member.

The inner upper electrode 60 serves as a shower head to supply the film forming source gas to the processing space PS formed between the upper electrodes 60 and 62 and the susceptor 12. More specifically, a gas diffusion space 72 is formed in the electrode support 66, and a plurality of gas injection holes 74 extending from the gas diffusion space 72 toward the susceptor 12 are formed in the electrode support 66 and the electrode plate 64.

A gas supply line 78 extending from a source gas supply unit (GSU) 76 is connected to a gas inlet port 72$a$ disposed at an upper portion of the gas diffusion space 72. Further, the outer upper electrode 62 as well as the inner upper electrode 60 may serve as a shower head.

A voltage application unit 5 for outputting a voltage to be applied is disposed outside the chamber 10. The voltage application unit 5 is connected to the upper electrodes 60 and 62 through a power supply line 88. The voltage application unit 5 includes a high frequency power supply 30, a matching unit (MU) 34, a variable DC power supply 80, a pulse generator (PG) 84, a filter (FL) 86, a superimposer 91, and on/off switches 92 and 93.

The high frequency power supply 30 is configured to generate a high frequency AC voltage (hereinafter, may be referred to as "high frequency voltage") for plasma generation and supply the generated high frequency voltage to the superimposer 91 through the matching unit 34 and the on/off switch 92.

When the on/off switch 92 is switched on, the high frequency voltage is supplied to the superimposer 91. When the on/off switch 92 is switched off, the high frequency voltage is not supplied to the superimposer 91. The frequency of the high frequency voltage generated by the high frequency power supply 30 is preferably, e.g., 400 kHz or more.

Figure 2:
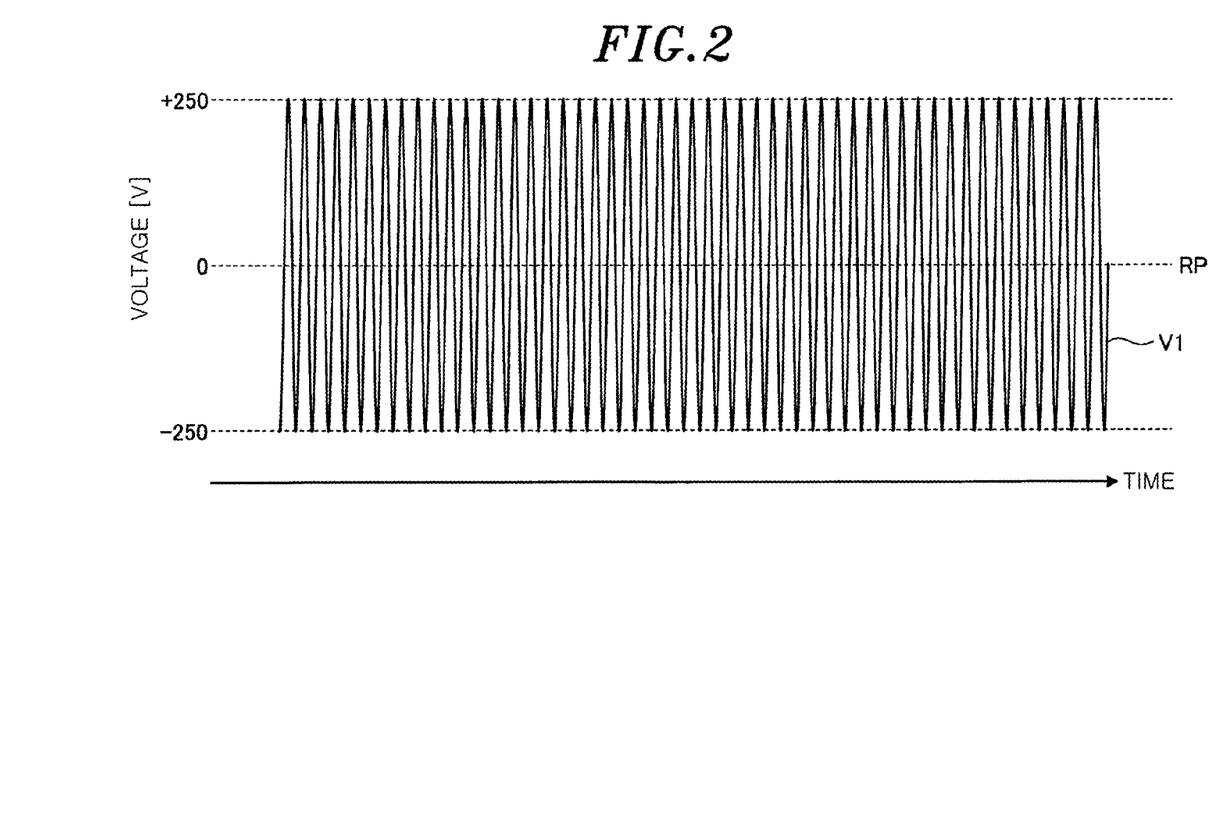
FIG. 2 shows an example of a high frequency voltage according to one embodiment.

FIG. 2 shows an example of the high frequency voltage according to the embodiment. As shown in FIG. 2, the high frequency power supply 30 generates a high frequency voltage V1 of −250 V to 250 V with 0 V as a reference potential RP, for example. The matching unit 34 is configured to match an impedance of the high frequency power supply 30 side and an impedance of a load (mainly, the electrode, the plasma, the chamber or the like) side.

An output terminal of the variable DC power supply 80 is connected to the pulse generator 84, and the variable DC power supply 80 is configured to output a negative DC voltage to the pulse generator 84. The pulse generator 84 is configured to generate a square wave DC pulse voltage using the negative DC voltage inputted from the variable DC power supply 80 and supply the generated DC pulse voltage to the superimposer 91 through the filter 86 and the on/off switch 93.

When the on/off switch 93 is switched on, a DC voltage is supplied to the superimposer 91. When the on/off switch 93 is switched off, the DC voltage is not supplied to the superimposer 91.

The frequency of the DC pulse voltage generated by the pulse generator 84 is preferably, e.g., in a range from 10 kHz to 1 MHz. A duty ratio of the DC pulse voltage generated by the pulse generator 84 is preferably in a range from 10% to 90%. The pulse generator 84 may output not a pulsed DC voltage (DC pulse voltage) but a constant DC voltage. An example of outputting a constant DC voltage will be described later in detail.

Figure 3:
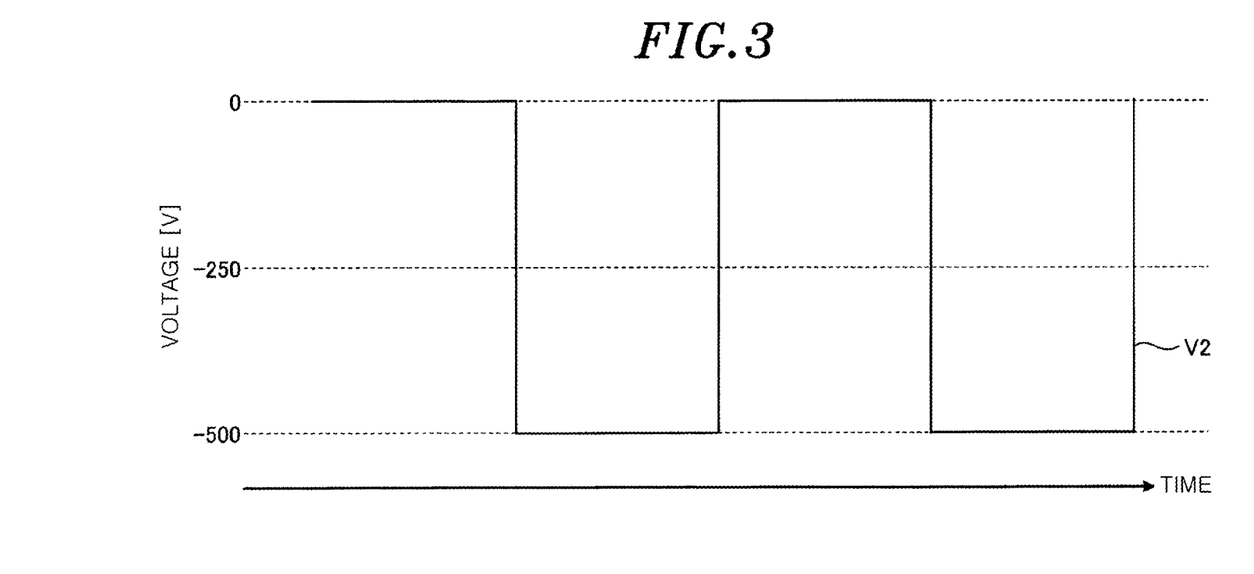
FIG. 3 shows an example of a DC pulse voltage according to one embodiment.

FIG. 3 shows an example of the DC pulse voltage according to the embodiment. As shown in FIG. 3, the pulse generator 84 generates a square wave DC pulse voltage V2 of −500V to 0V, for example. The filter 86 is configured to output the DC pulse voltage outputted from the pulse generator 84 to the superimposer 91 and to allow the high frequency voltage outputted from the high frequency power supply 30 to flow to the ground and prevent the high frequency voltage flowing to the pulse generator 84.

The superimposer 91 is configured to superimpose the high frequency voltage outputted from the high frequency power supply 30 with the DC pulse voltage outputted from the pulse generator 84 to generate a voltage (hereinafter, may be referred to as "superimposed voltage") in which the high frequency voltage and the DC pulse voltage are superimposed. The generated superimposed voltage is applied to the upper electrodes 60 and 62 through the power supply line 88.

Figure 4:
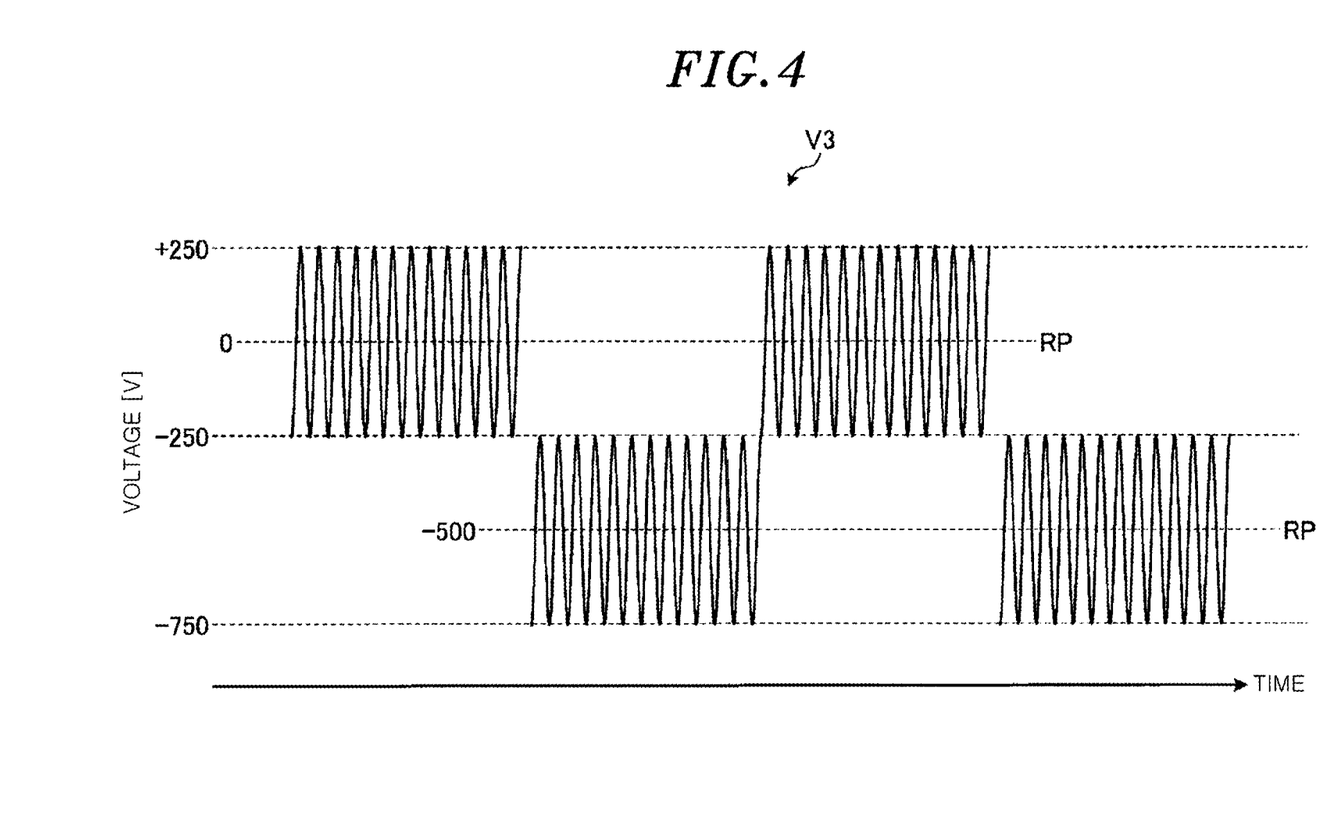
FIG. 4 shows an example of a superimposed voltage according to one embodiment.

FIG. 4 shows an example of the superimposed voltage according to the embodiment. When the high frequency voltage V1 shown in FIG. 2 and the DC pulse voltage V2 shown in FIG. 3 are superimposed, a superimposed voltage V3 is generated as shown in FIG. 4.

In the superimposed voltage V3, by superimposing the DC pulse voltage with the high frequency voltage, the reference potential RP of the high frequency voltage V1 (see FIG. 2) fluctuates up and down alternately as time elapses in response to the waveform of the square wave DC pulse voltage V2 (see FIG. 3), as shown in FIG. 4. In other words, when the on/off switches 92 and 93 are switched on, the voltage application unit 5 outputs the high frequency voltage changing in a pulsed form (i.e., a square wave shape) from the superimposer 91.

A switching unit (SW) 6 is connected to the voltage application unit 5 of the film forming apparatus 1. The switching unit 6 is configured to control the on/off switches 92 and 93 to selectively switch the voltage applied to the upper electrodes 60 and 62 among the high frequency voltage, the DC pulse voltage, and the superimposed voltage.

Specifically, the switching unit 6 controls both of the on/off switches 92 and 93 to be switched on, so that the superimposed voltage is outputted from the superimposer 91 by supplying the high frequency voltage and the DC pulse voltage to the superimposer 91. Further, the switching unit 6 controls the on/off switch 92 to be switched on and controls the on/off switch 93 to be switched off, so that the high frequency voltage is outputted from the superimposer 91 by supplying only the high frequency voltage to the superimposer 91.

Further, the switching unit 6 controls the on/off switch 92 to be switched off and controls the on/off switch 93 to be switched on, so that the DC pulse voltage is outputted from the superimposer 91 by supplying only the DC pulse voltage.

A ring-shaped ground part 96 made of a conductive member, e.g., nickel, aluminum, or the like, is disposed at an appropriate location (e.g., at a radially outer side of the outer upper electrode 62) facing the processing space PS in the chamber 10.

The ground part 96 is attached to a ring-shaped insulator 98 made of, e.g., ceramic, and is connected to a ceiling wall of the chamber 10. The ground part 96 is grounded through the chamber 10. When the superimposed voltage is applied from the voltage application unit 5 to the upper electrodes 60 and 62 during the plasma processing, an electron current flows between the upper electrodes 60 and 62 and the ground part 96 through the plasma.

The operations of the respective components (e.g., the gas exhaust unit (GEU) 26, the high frequency power supply 30, the switching unit 6, the source gas supply unit 76, the chiller unit, the heat transfer gas supply unit, and the like) of the film forming apparatus 1 and the overall operation (sequence) of the film forming apparatus 1 are controlled by a controller (not shown). The controller may be, e.g., a microcomputer.

<Film Forming Process in the Film Forming Apparatus>

Figure 5:
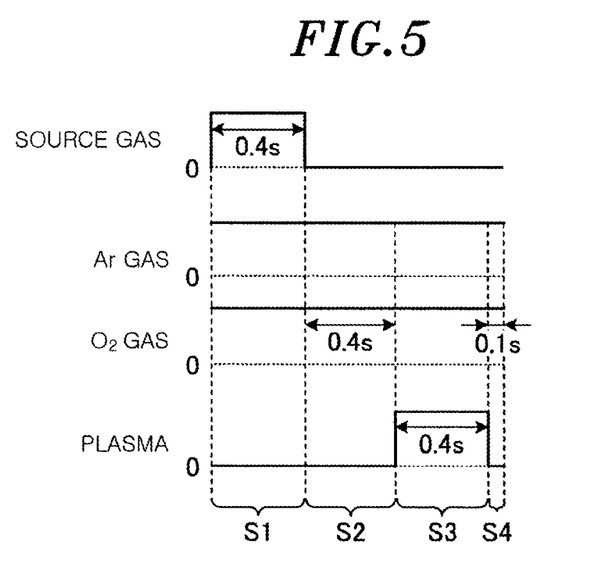
FIG. 5 is a timing chart showing an example of a film forming process according to one embodiment.

Next, the flow of the film forming process in the film forming apparatus 1 will be described with reference to FIG. 5. FIG. 5 is a timing chart showing the flow of the film forming process according to the embodiment.

In order to form a film in the film forming apparatus 1, first, the gate valve 28 is opened, and the semiconductor wafer W to be processed is loaded into the chamber 10 and mounted on the susceptor 12 or on the electrostatic chuck 40. When the substrate W is mounted on the electrostatic chuck 40, the on/off switch 44 is switched on, and the semiconductor wafer W is attracted and held on the electrostatic chuck 40 by an electrostatic adsorptive force. Then, a heat transfer gas is supplied to a space between the electrostatic chuck 40 and the semiconductor wafer W.

Then, as shown in FIG. 5, a source gas as a film forming source gas and a purge gas are introduced into the chamber 10 at predetermined flow rates from the source gas supply unit 76, and a pressure in the chamber 10 is set to a set value by the gas exhaust unit 26 (step S1).

For example, in the case of forming a $TiO_2$ film, it is preferable to use tetrakis dimethylamino titanium (TDMAT) gas as the source gas. Alternatively, it is possible to use another Ti-containing gas such as titanium tetrachloride ($TiCl_4$), tetra(isopropoxy)titanium (TTIP), titanium tetrabromide ($TiBr_4$), titanium tetraiodide ($TiI_4$), tetrakis ethylmethylamino titanium (TEMAT), or the like.

As for the purge gas, a mixed gas of Ar gas and $O_2$ gas (hereinafter, may be referred to as "$Ar/O_2$ gas") or the like is used, for example.

Next, the supply of the source gas is stopped (step S2). Accordingly, a surface of the semiconductor wafer W is purged with the $Ar/O_2$ gas, and excessive molecules of the source gas adhered to the surface of the semiconductor wafer W are removed.

Next, a predetermined voltage is applied to the upper electrodes 60 and 62 by using the high frequency power supply 30 and the variable DC power supply 80 to generate plasma in the processing space PS (step S3). Oxygen molecules become plasma by being discharged between the upper electrodes 60 and 62 and the susceptor 12 serving as the lower electrode. Oxygen radicals or oxygen ions generated from the plasma react with the molecules of the source gas adsorbed on the surface of the semiconductor wafer W. Accordingly, a $TiO_2$ film is formed on the surface of the semiconductor wafer W.

Next, the generation of plasma in the processing space PS is stopped (step S4). Therefore, the surface of the semiconductor wafer W is purged with the $Ar/O_2$ gas, and excessive $TiO_2$ molecules are removed. Accordingly, a $TiO_2$ film of one atomic layer is formed. By repeating the steps S1 to S4, a $TiO_2$ film having a desired film thickness can be formed on the surface of the semiconductor wafer W.

For example, as shown in FIG. 5, the $TiO_2$ film can be formed on the surface of the semiconductor wafer W by executing the step S1 for 0.4 seconds, the step S2 for 0.4 seconds, the step S3 for 0.4 seconds, and the step S4 for 0.1 seconds. The duration of each of the steps S1 to S4 is not limited thereto.

<Test Results>

Figure 6:
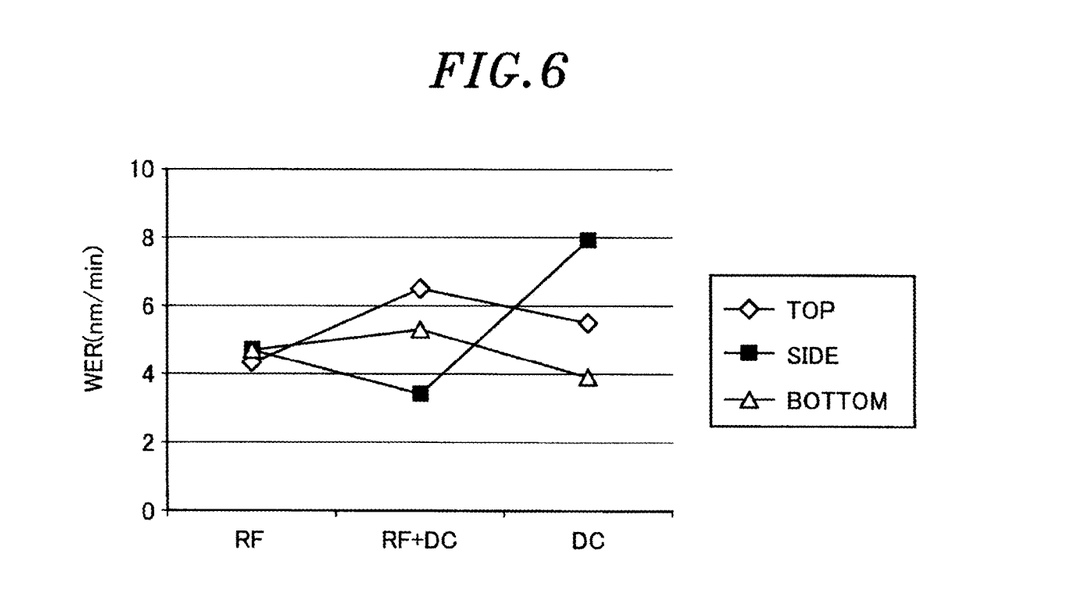
FIG. 6 shows an example of a wet etching rate (WER) at a top position, a side position and a bottom position of a $TiO_2$ film formed under each of different plasma generation conditions of one embodiment.

Next, there will be described test results on various characteristics of $TiO_2$ films formed under various conditions using the film forming apparatus 1 with reference to FIGS. 6 to 10. FIG. 6 shows a wet etching rate (WER) at a top position, a side position and a bottom position of the $TiO_2$ film formed under each of different plasma generation conditions according to the embodiment.

The test results show the WER each obtained in the case that multiple rectangular protrusions are formed side by side on the semiconductor wafer W and the $TiO_2$ film is formed thereon. The WER was evaluated at an upper surface of the protrusion (hereinafter, may be referred to as "top position"), a side surface of the protrusion (hereinafter, may be referred to as "side position"), and a bottom surface between adjacent protrusions (hereinafter, may be referred to as "bottom position").

In this test, the formation of the $TiO_2$ film was performed by executing the step S3 for 0.4 seconds at a pressure of 0.5 Torr without operating the impedance adjustment circuit 100 in a state where the semiconductor wafer W was grounded.

Then, the plasma generation in the step S3 in the case of applying the high frequency voltage (RF 200 W) to the upper electrodes 60 and 62, the plasma generation in the step S3 in the case of applying the superimposed voltage (RF 200 W+DC 330 V) to the upper electrodes 60 and 62, and the plasma generation in the step S3 in the case of applying the DC pulse voltage (DC 410 V) to the upper electrodes 60 and 62 were compared with one another. The frequency of the high frequency voltage was 13.56 MHz. The frequency of the DC pulse voltage was 500 kHz. The duty ratio of the DC pulse voltage was 50% (hereinafter, these conditions are the same for the test examples described below).

As shown in FIG. 6, the WER is substantially the same at the top position, the side position and the bottom position by generating plasma with the high frequency voltage (indicated by "RF" in FIG. 6). In other words, in the embodiment, a $TiO_2$ film having the uniform WER can be formed on the irregular surface of the semiconductor wafer W by generating plasma with the high frequency voltage.

Further, the WER at the side position can be smaller than the WER at each of the top position and the bottom position by generating plasma with the superimposed voltage (indicated by "RF+DC" in FIG. 6). In other words, in the embodiment, by generating the plasma with the superimposed voltage, the $TiO_2$ film at the side position serving as a mask can easily remain in the case of applying the $TiO_2$ film to spacers of a double patterning process.

Further, the WER at the side position can be greater than the WER at each of the top position and the bottom position by generating plasma with the DC pulse voltage (indicated by "DC" in FIG. 6). In other words, in the embodiment, by generating plasma with the DC pulse voltage, a $TiO_2$ film can be efficiently formed in the case of selectively forming the $TiO_2$ film at the top position and the bottom position of the irregular surface of the semiconductor wafer W.

As described above, in accordance with the embodiment, the WER of the thin film formed by the identical film forming apparatus 1 can be variously controlled by allowing the switching unit 6 to switch the voltage applied to the upper electrodes 60 and 62 to the high frequency voltage, the superimposed voltage or the DC pulse voltage.

It was found that the WER of the thin film is considerably changed depending on types of voltages to be applied because incidence distribution and flux of ions or radicals in the plasma are considerably changed depending on the types of the voltages to be applied to a horizontal plane (i.e., the top position or the bottom position) and to a vertical plane (i.e., the side position).

Figure 7:
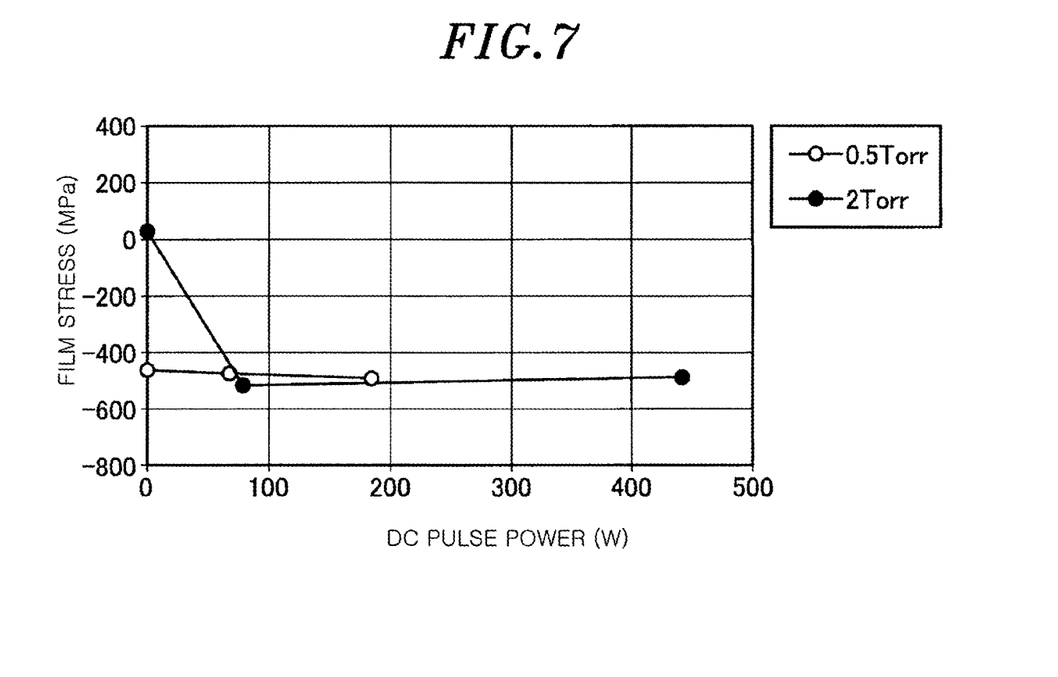
FIG. 7 shows a first example of a relationship between a DC pulse power and a film stress in the superimposed voltage of one embodiment.

FIG. 7 shows a first example of a relationship between a DC pulse power and a film stress in a superimposed voltage of the embodiment. This test result shows the film stress in the case of forming a $TiO_2$ film on a flat semiconductor wafer W. The film stress of the $TiO_2$ film is a significant parameter in applying the $TiO_2$ film to the spacers of the double patterning process.

In this test, the formation of the $TiO_2$ film was performed by executing the step S3 for 0.4 seconds at pressures of 0.5 Torr and 2 Torr without operating the impedance adjustment circuit 100 in a state where the semiconductor wafer W was grounded. Then, the plasma was generated by applying a constant superimposed voltage (RF 200 W) and various DC pulse voltages to the upper electrodes 60 and 62, and the film stresses at the respective DC pulse voltages were plotted.

As shown in FIG. 7, when the pressure is 2 Torr, the film stress can be tensile (positive) by setting the DC pulse power to zero, i.e., by generating plasma with a high frequency voltage. On the other hand, under the same condition, the film stress can be compressive (negative) by applying a DC pulse power, i.e., by generating plasma with a superimposed voltage.

As described above, in accordance with the embodiment, the film stress of the thin film formed by the identical film forming apparatus 1 can be variously controlled by allowing the switching unit 6 to switch the voltage applied to the upper electrodes 60 and 62 to the high frequency voltage or the superimposed voltage.

Figure 8:
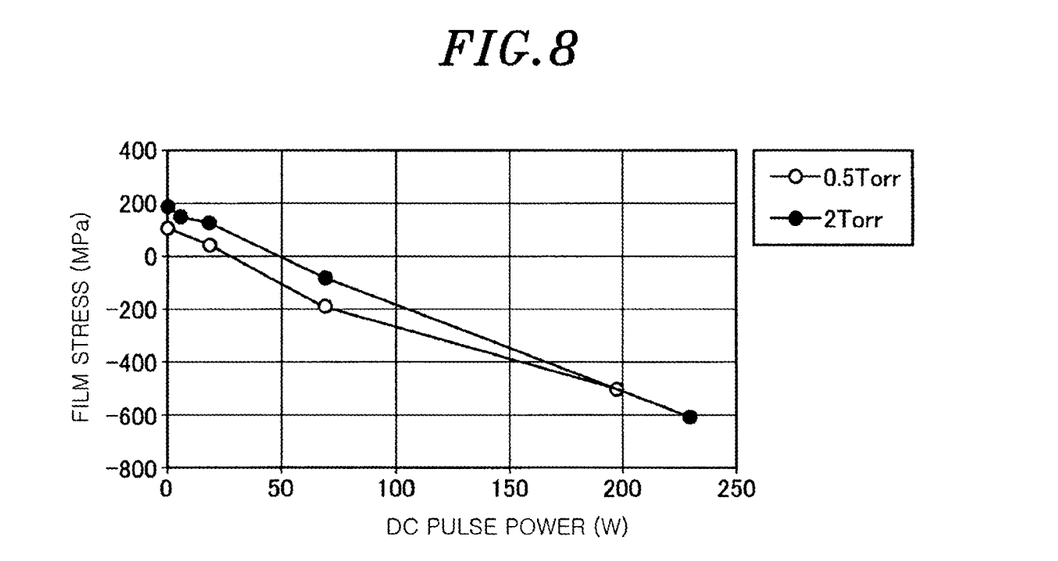
FIG. 8 shows a second example of a relationship between a DC pulse power and a film stress in the superimposed voltage of one embodiment.

FIG. 8 shows a second example of the relationship between the DC pulse power and the film stress in the superimposed voltage of the embodiment. This test result was obtained when the $TiO_2$ film was formed under the same condition as that in the test result shown in FIG. 7 except that the impedance adjustment circuit 100 was operated to set the semiconductor wafer W to a floating state.

As shown in FIG. 8, by setting the DC pulse power to zero, i.e., by generating plasma with a high frequency voltage, the film stress can be more tensile (positive) compared to that in the example shown in FIG. 7 at any pressure. Further, under the same condition, by applying the DC pulse power, i.e., by generating plasma with the superimposed voltage, the film stress can be controlled to be compressive (negative) in a stepwise manner.

As described above, in accordance with the embodiment, by operating the impedance adjustment circuit 100, the film stress of the thin film formed by the identical film forming apparatus 1 can be more variously controlled.

Figure 9:
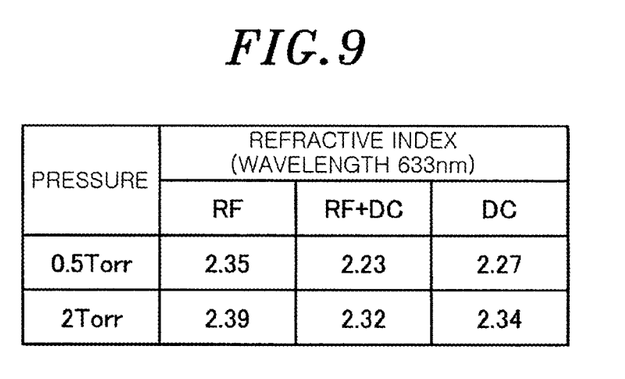
FIG. 9 shows an example of a refractive index of a $TiO_2$ film formed under each of different plasma generation conditions of one embodiment.

FIG. 9 shows a refractive index of the $TiO_2$ film formed under each of different plasma generation conditions of the embodiment. The test results show the changes in the refractive index in the case that the $TiO_2$ film is formed on a flat semiconductor wafer W.

In this test, the formation of the $TiO_2$ film was performed by executing the step S3 for 0.4 seconds at pressures of 0.5 Torr and 2 Torr without operating the impedance adjustment circuit 100 in a state where the semiconductor wafer W was grounded.

Then, the plasma generation in the step S3 in the case of applying the high frequency voltage (RF 200 W) to the upper electrodes 60 and 62, the plasma generation in the step S3 in the case of applying the superimposed voltage (RF 200 W+DC 330 V) to the upper electrodes 60 and 62, and the plasma generation in the step S3 in the case of applying the DC pulse voltage (DC 410 V) to the upper electrodes 60 and 62 were compared with one another.

As shown in FIG. 9, the refractive index of the $TiO_2$ film at a wavelength of 633 nm can be variously controlled from 2.23 to 2.39 by generating plasma while changing types of voltages to be applied and pressures.

As described above, in accordance with the embodiment, the refractive index of the thin film formed by the identical plasma processing apparatus 1 can be variously controlled by allowing the switching unit 6 to switch the voltage applied to the upper electrodes 60 and 62 to the high frequency voltage, the superimposed voltage, or the DC pulse voltage.

Figure 10:
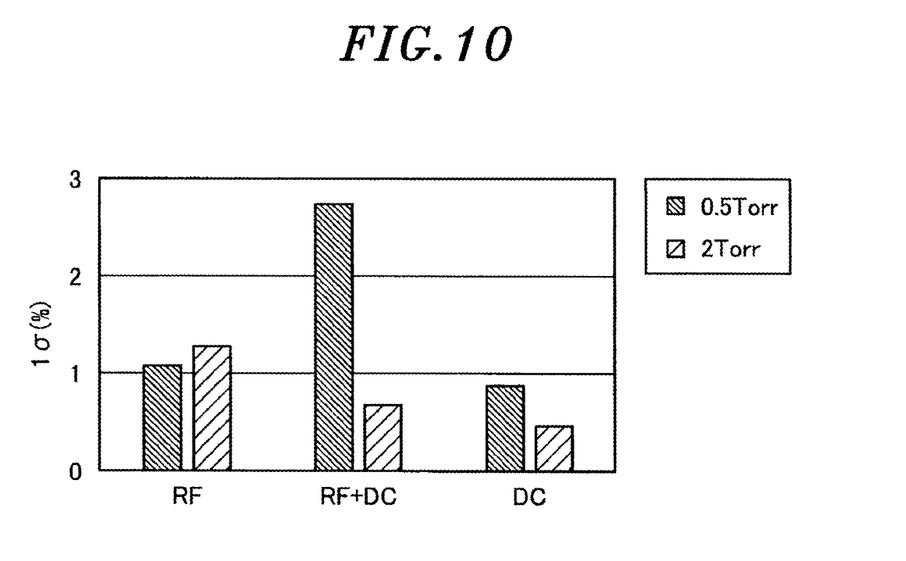
FIG. 10 shows an example of uniformity of a film formed under each of different plasma generation conditions of one embodiment.

FIG. 10 shows uniformity of a film formed under each of different plasma generation conditions of the embodiment. In FIG. 10, the uniformity of the $TiO_2$ film formed on the semiconductor wafer W under the same condition as those in the example shown in FIG. 9 is indicated by a value of 16.

As shown in FIG. 10, when the pressure is 2 Torr, the uniformity of the film can be improved by generating the plasma with a superimposed voltage or a DC pulse voltage, compared to the case of generating the plasma with a high frequency voltage. Even when the pressure is 0.5 Torr, the uniformity of the film can be improved by generating the plasma with the DC pulse voltage, compared to the case of generating the plasma with the high frequency voltage.

<Application of Constant DC Voltage>

Figure 11:
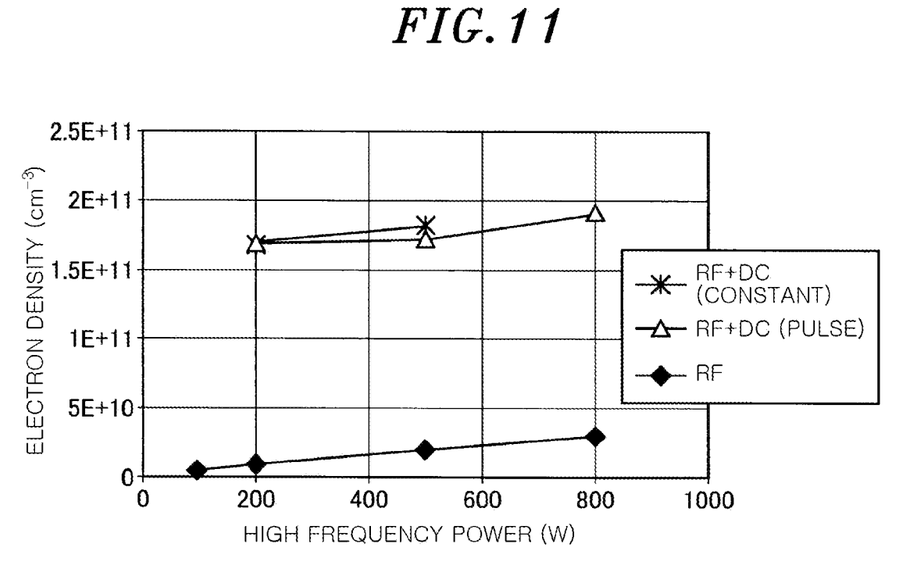
FIG. 11 shows a first example of an electron density in the case that a constant DC voltage is superimposed with a high frequency voltage and in the case that a DC pulse voltage is superimposed with a high frequency voltage.
Figure 12:
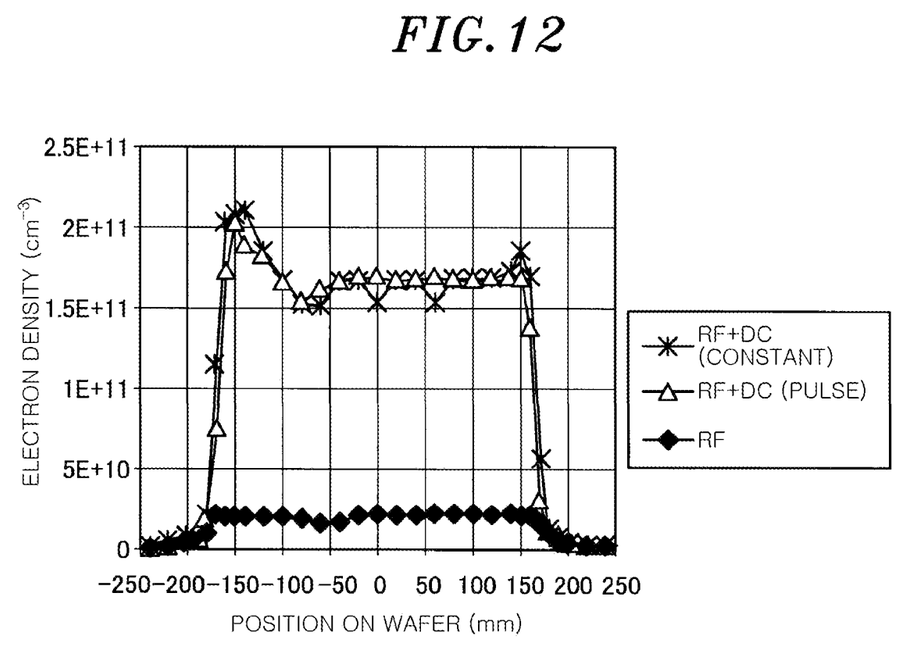
FIG. 12 shows a second example of the electron density in the case that the constant DC voltage is superimposed with the high frequency voltage and in the case that the DC pulse voltage is superimposed with the high frequency voltage.

Next, the case that a pulsed DC voltage (i.e., DC pulse voltage) is superimposed with a high frequency voltage to obtain the superimposed voltage and the case that a constant DC voltage is superimposed with a high frequency voltage to obtain the superimposed voltage will be compared with reference to FIGS. 11 and 12.

As described above, the pulse generator 84 connected to the variable DC power supply 80 may output a constant DC voltage as well as a DC pulse voltage and, thus, the constant DC voltage can be superimposed with the high frequency voltage to obtain the superimposed voltage. Therefore, the difference in the effect between the case that the constant DC voltage is superimposed with the high frequency voltage and the case that the DC pulse voltage is superimposed with the high frequency voltage will be evaluated hereinafter.

FIG. 11 shows a first example of an electron density in the case of superimposing the constant DC voltage with the high frequency voltage and in the case of superimposing the DC pulse voltage with the high frequency voltage. Specifically, FIG. 11 shows the results of the electron density evaluated by plasma measurement in the above both cases with a constant DC power of 300 W while varying the high frequency power. In FIGS. 11 and 12, the plasma measurement result obtained in the case of applying only a high frequency voltage is also shown for the sake of better understanding.

As shown in FIG. 11, the electron density in the plasma can be considerably increased by superimposing the DC pulse voltage with the high frequency voltage, compared to the case of applying only the high frequency voltage. Even when the constant DC voltage is superimposed with a high frequency voltage, it is possible to increase the electron density as in the case of superimposing the DC pulse voltage with the high frequency voltage.

FIG. 12 shows a second example of an electron density in the case of superimposing the constant DC voltage with the high frequency voltage and in the case of superimposing the DC pulse voltage with the high frequency voltage to thereby show the in-plane distribution of the electron density in the above both cases.

As shown in FIG. 12, even when the constant DC voltage is superimposed with the high frequency voltage, it is possible to obtain the similar in-plane distribution as that in the case of superimposing the DC pulse voltage with the high frequency voltage.

As described above, in the embodiment, when a constant DC voltage is superimposed with a high frequency voltage, it is possible to obtain the substantially same effect as that obtained when the DC pulse voltage is superimposed with the high frequency voltage. Therefore, in accordance with the embodiment, the film quality of the thin film formed by the identical film forming apparatus can be variously controlled even when the constant DC voltage is superimposed with the high frequency voltage.

Further, since the constant DC voltage is superimposed with the high frequency voltage, the pulse generator 84 of the voltage application unit 5 becomes unnecessary, which makes it possible to reduce the manufacturing cost of the film forming apparatus 1.

As described above, in the embodiment, the film forming apparatus 1 includes the vacuum-evacuable processing chamber 10, the susceptor 12 serving as the lower electrode, the upper electrodes 60 and 62, the source gas supply unit 76, the voltage application unit 5, and the switching unit 6. A target substrate to be processed is mounted on the susceptor 12. The upper electrodes 60 and 62 are disposed to face the susceptor 12 in the chamber 10. The source gas supply unit 76 supplies a film forming source gas to be formed into plasma to the processing space PS between the upper electrodes 60 and 62 and the susceptor 12. The voltage application unit 5 includes the high frequency power supply 30 and the variable DC power supply 80 and applies a voltage outputted from at least one of the high frequency power supply 30 and the variable DC power supply 80 to the upper electrodes 60 and 62. The switching unit 6 selectively switches the voltage outputted from the voltage application unit 5 to upper electrodes 60 and 62 among a high frequency voltage supplied from the high frequency power supply 30, a DC voltage outputted from the variable DC power supply 80, and a superimposed voltage in which a DC voltage is superimposed with the high frequency voltage.

Accordingly, the film quality of the thin film formed by the identical film forming apparatus 1 can be variously controlled.

In the embodiment, the film forming apparatus 1 may include the impedance adjustment circuit 100 connected between the susceptor 12 and the ground. Accordingly, the film stress of the thin film formed by the identical film forming apparatus 1 can be more variously controlled.

Further, in the embodiment, the DC voltage outputted from the variable DC power supply 80 may be a pulsed DC voltage. Therefore, the uniformity of the film formed on the semiconductor wafer W can be improved.

In the embodiment, the DC voltage outputted from the variable DC power supply 80 may be a constant voltage. Accordingly, the manufacturing cost of the film forming apparatus 1 can be reduced.

While the embodiment of the present disclosure has been described, the present disclosure is not limited thereto and can be variously modified without departing from the scope thereof. For example, in the above embodiment, when a single layer film is formed by repeating the steps S1 to S4, types of voltages to be applied are fixed. However, the types of voltages to be applied during the repetitive execution of the steps S1 to S4 may be appropriately changed.

For example, it is possible to form a film having a tensile film stress by generating plasma with a high frequency voltage in a first half of the film forming process and to form a film having a compressive film stress by generating plasma with a superimposed voltage in a second half of the film forming process. Accordingly, the entire film stress can be close to zero.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosure.

What is claimed is:

1. A film forming method performed by using a film forming apparatus comprising a vacuum-evacuable processing chamber, a lower electrode on which a target substrate to be processed is mounted in the processing chamber, an upper electrode disposed to face the lower electrode in the processing chamber and configured to supply a film forming source gas to the processing chamber, a high frequency power supply configured to supply a high frequency voltage, a DC power supply configured to supply a DC voltage, and a superimposer configured to receive at least one of the DC voltage or the high frequency voltage and output one of the DC voltage, the high frequency voltage, or a superimposed voltage based on the DC voltage and the high frequency voltage to the upper electrode, the film forming method comprising:

receiving, by the superimposer, the high frequency voltage from the high frequency power supply without receiving the DC voltage from the DC power supply and outputting the high frequency voltage to the upper electrode;

forming a first film on a surface of the target substrate by a first film forming process in which a first plasma of the film forming source gas is generated in the processing chamber responsive to the upper electrode being applied the high frequency voltage output by the superimposer, the first film formed on the surface of the target substrate having a tensile film stress;

stopping the output of the high frequency voltage to the upper electrode after the first film is formed;

receiving, by the superimposer, the high frequency voltage from the high frequency power supply and the DC voltage from the DC power supply after the output of the high frequency voltage is stopped and outputting the superimposed voltage to the upper electrode that is generated using the high frequency voltage and the DC voltage; and forming a second film on the first film in a second film forming process in which a second plasma of the film forming source gas is generated in the processing chamber responsive to the upper electrode being applied the superimposed voltage output by the superimposer, the second film having a compressive film stress, wherein each of the first film forming process and the second film forming process comprises:

a) supplying the film forming source gas to the processing chamber;

b) stopping supply of the film forming source gas to the processing chamber;

c) generating the plasma of the film forming source gas in the processing chamber; and d) stopping generation of the plasma of the film forming source gas in the processing chamber.

2. The film forming method of claim 1, wherein the DC voltage is a pulsed DC voltage.

3. The film forming method of claim 1, wherein the DC voltage is a constant voltage.

4. The film forming method of claim 1, wherein the film formed on the surface of the target substrate is $TiO_2$ film.

5. The film forming method of claim 4, wherein the film forming source gas includes at least one of tetrakis dimethylamino titanium (TDMAT), titanium tetrachloride ($TiCl_4$), tetra(isopropoxy)titanium (TTIP), titanium tetrabromide ($TiBr_4$), titanium tetraiodide ($TiI_4$), and tetrakis ethylmethylamino titanium (TEMAT).

6. The film forming method of claim 4, wherein multiple protrusions are formed on the surface of the target substrate, and the film is formed at least one of upper surfaces of the protrusions, side surfaces of the protrusions, and bottom surfaces between adjacent protrusions.

7. The film forming method of claim 6, wherein the $TiO_2$ film is a spacer of a double patterning process and the voltage applied to the upper electrode is the superimposed voltage.

8. The film forming method of claim 6, wherein the $TiO_2$ film is formed on the upper surfaces of the protrusions and the bottom surfaces between adjacent protrusions, and the voltage applied to the upper electrode is the DC voltage.

9. The film forming method of claim 1, wherein the first film having the tensile film stress and the second film having the compressive film stress collectively have an entire film stress of zero.

* * * * *